(12) United States Patent
Nakagawa et al.

(10) Patent No.: US 8,324,608 B2
(45) Date of Patent: Dec. 4, 2012

(54) NONVOLATILE STORAGE ELEMENT AND MANUFACTURING METHOD THEREOF

(75) Inventors: Takashi Nakagawa, Tokyo (JP);
Eun-mi Kim, Hwaseong-Si (KR);
Yuichi Otani, Tokyo (JP); Naomu Kitano, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/451,265

(22) Filed: Apr. 19, 2012

(65) Prior Publication Data

US 2012/0248397 A1 Oct. 4, 2012

Related U.S. Application Data

(63) Continuation of application No. PCT/JP2010/067561, filed on Oct. 6, 2010.

(30) Foreign Application Priority Data

Oct. 27, 2009 (JP) ................................ 2009-246134

(51) Int. Cl.
*H01L 47/00* (2006.01)

(52) U.S. Cl. ..................... 257/4; 257/E45.003

(58) Field of Classification Search ......................... None
See application file for complete search history.

(56) References Cited

U.S. PATENT DOCUMENTS

| | | | |
|---|---|---|---|
| 6,956,278 B2 * | 10/2005 | Herner | 257/530 |
| 7,446,391 B2 | 11/2008 | Odagawa et al. | |
| 7,456,420 B2 * | 11/2008 | Cote et al. | 257/4 |
| 7,829,875 B2 * | 11/2010 | Scheuerlein | 257/2 |
| 7,981,805 B2 | 7/2011 | Kodaira et al. | |
| 8,274,815 B2 * | 9/2012 | Ichihara et al. | 365/148 |
| 2012/0021612 A1 | 1/2012 | Nakagawa et al. | |
| 2012/0043617 A1 | 2/2012 | Nakagawa et al. | |

FOREIGN PATENT DOCUMENTS

| | | |
|---|---|---|
| JP | 6-291272 A | 10/1994 |
| JP | 3919205 B2 | 5/2007 |
| JP | 2009-141275 A | 6/2009 |
| WO | 2008/140979 A1 | 11/2008 |
| WO | 2009/104789 A1 | 8/2009 |
| WO | 2010/125810 A1 | 11/2010 |

OTHER PUBLICATIONS

International Preliminary Report on Patentability in International Application No. PCT/JP2010/067561 (issued Jun. 12, 2012).
S. Seo et al., "Conductivity Switching Characteristics and Reset Currents in NiO Films," 86 Appl. Phys. Lett. 093509 (1-3) (Feb. 2005).
Z. Wei et al., "Highly Reliable TaOx ReRAM and Direct Evidence of Redox Reaction Mechanism," IEDM Tech. Dig., pp. 293-296 (2005).
B. Gao et al., "Oxide-Based RRAM: Uniformity Improvement Using a New Material-Oriented Methodology," Symposium on VLSI Technology Digest of Technical Papers, pp. 30-31 (2009).
H.Y. Lee et al., "Low Power and High Speed Bipolar Switching with a Thin Reactive Ti Buffer Layer in Robust HfO2 Based RRAM," IEDM Tech. Dig., pp. 297-300 (2008).
International Search Report in International Application No. PCT/JP2010/067561 (issued Dec. 28, 2010).

* cited by examiner

*Primary Examiner* — Hoang-Quan Ho
(74) *Attorney, Agent, or Firm* — Fitzpatrick, Cella, Harper & Scinto

(57) ABSTRACT

In a variable resistance nonvolatile storage element, an electrode suitable for a variable resistance operation and formed of a metallic nitride layer containing Ti and N is provided. In a nonvolatile storage device including: a first electrode; a second electrode; and a variable resistance layer which is sandwiched between the first electrode and the second electrode and in which a resistance value changes to two different resistance states, at least one of the first electrode and the second electrode is an electrode including a metallic nitride layer containing at least Ti and N, and a mole ratio (N/Ti ratio) between Ti and N in at least a part of the metallic nitride layer, the part being in contact with the variable resistance layer is 1.15 or more and a film density is 4.7 g/cc or more.

7 Claims, 6 Drawing Sheets

NONVOLATILE STORAGE ELEMENT AND MANUFACTURING METHOD THEREOF

CROSS-REFERENCES TO RELATED APPLICATIONS

This application is a continuation application of International Application No. PCT/JP2010/067561, filed Oct. 6, 2010, which claims the benefit of Japanese Patent Application No. 2009-246134, filed Oct. 27, 2009. The contents of the aforementioned applications are incorporated herein by reference in their entities.

TECHNICAL FIELD

The present invention relates to a nonvolatile storage element and a manufacturing method thereof, and more particularly relates to a variable resistance nonvolatile storage element and a technology on a manufacturing method thereof.

BACKGROUND ART

A flash memory that is mainstream at present and that uses a floating gate, has a problem that as the size of a memory cell is reduced, variations in threshold voltage (Vth) occur due to interference by capacitive coupling between the floating gates of adjacent cells. Hence, as a memory suitable for the reduction in size, a variable resistance nonvolatile storage element with a variable resistance layer sandwiched between electrodes is being developed. This variable resistance nonvolatile storage element is characterized in that the electrical resistance of the resistance layer is electrically stimulated so as to be switched between two values or more; since the variable resistance nonvolatile storage element is simple in structure and operation, it is expected to be a nonvolatile storage element that can be reduced in size and cost.

As a layer (a variable resistance layer) in which resistance varies with an applied voltage, there are oxides of elements selected from a group formed of transition metals; examples of the oxides include a nickel oxide (NiO), a vanadium oxide ($V_2O_5$), a zinc oxide (ZnO), a niobium oxide ($Nb_2O_5$), a titanium oxide ($TiO_2$), a tungsten oxide ($WO_3$), a cobalt oxide (CoO) and a tantalum oxide ($Ta_2O_5$). As the variable resistance layer, there are metallic oxides that have compositions displaced from stoichiometric compositions formed of Ni, Ti, Ta, Hf, Nb, Zn, W, Co and the like.

Although the principle of operation of the resistance change is unclear, the following principles have been reported: a voltage is applied to the variable resistance layer, thus a current path called a filament is formed in the variable resistance layer and the resistance of the element varies with the state of the connection between the filament and upper and lower electrodes; the resistance of the variable resistance layer varies by the movement of oxygen atoms in the interface between the electrodes and the variable resistance layer.

FIG. 12 is a schematic diagram showing the cross-sectional structure of a conventional variable resistance nonvolatile storage element (ReRAM: resistive random access memory) with reference to patent document 1. The variable resistance element (memory element) 610 of a general ReRAM has a parallel-plate type laminate structure in which a variable resistance film (for example, a transition metal oxide film) 613 is sandwiched between a lower electrode 612 formed on an interlayer insulation film 611 and an upper electrode 614. When a voltage is applied between the upper electrode 614 and the lower electrode 612, the electrical resistance of the variable resistance film 613 varies, and the variable resistance film 613 takes two different resistance states (the reset state and the set state). Patent document 2 discloses that, as the material of the upper electrode 614, a material containing Pt is used, and as the material of the lower electrode 612, a material containing at least one element selected from Ru, Ti, Al, Ta, Cu, W and Ni is used.

In the operating mechanism of the variable resistance element 610, as an initial operation for allowing the resistance state to be electrically transited between two resistance states, a forming voltage is first applied. The application of the forming voltage results in the state where a filament serving a current path can be formed in the variable resistance film 613. Thereafter, an operation voltage (a set voltage and a reset voltage) is applied, and thus the state of the generation of the filament is changed, with the result that a set/reset operation, that is, writing and deletion are performed. As the area of an operation region of the variable resistance element 610 is increased, the number of filaments is increased; when the number of filaments is increased, variations in the control of the reset current are produced, and consequently, an operation as a memory varies. The operation area of the variable resistance element 610 is preferably small so that the requirement for achieving high density is satisfied and a stable and highly reliable operation is realized. However, as described above, in the conventional structure, the size reduction is limited by the accuracy of processing in the photolithography technology.

Patent document 1 proposes a nonvolatile storage device in which Pt is used as upper and lower electrodes and a variable resistance layer is formed of NiO; patent document 1 discloses that a current path called filament is formed in a Ni oxide, and the resistance varies. Moreover, non-patent document 2 proposes a nonvolatile storage device in which Pt is used as upper and lower electrodes and a variable resistance layer is formed of TaOx; non-patent document 2 discloses that the resistance varies by the movement of oxygen atoms in the interface layer between the Pt electrode and TaOx.

Attention is given to a technology on a variable resistance element that uses as an electrode material a titanium nitride electrode on which etching processing is easily performed. Non-patent document 3 proposes a nonvolatile storage device in which Pt is used as a lower electrode, HfOx or HfAlOx is used as a variable resistance layer and TiN is used as an upper electrode; non-patent document 3 discloses that HfAlOx is used as the variable resistance layer and thus variations in operation voltage can be reduced. Furthermore, non-patent document 4 discloses that a TiN/Ti/HfO2/TiN laminate structure is subjected to oxygen annealing, thus a TiN/TiOx/HfOx/TiN laminate structure is produced and consequently, a resistance varying operation is achieved.

[Patent document 1] Japanese Unexamined Patent Application Publication No. 2009-141275
[Patent document 2] Japanese Patent No. 3919205
[Non-patent document 1] Applied Physics Letters 86, 093509 (2005)
[Non-patent document 2] International Electron Devices Meeting Technical Digest, 2008, p. 293 to p. 296
[Non-patent document 3] Symposium on VLSI Technology Digest of Technical Papers, 2009, p. 30 to p. 31
[Non-patent document 4] International Electron Devices Meeting Technical Digest, 2008, p. 297 to p. 300

SUMMARY OF INVENTION

However, the following problems are present on the technologies described above. Firstly, the technology that uses the Pt electrode as the electrode of the variable resistance element as disclosed in non-patent document 1, is effective in reducing the instability of the operation in the characteristic of the element resulting from the oxidation of the electrode, but has problems that etching is difficult in an electrode processing process and reducing the material cost is difficult. Secondly, in the method disclosed in non-patent document 4, the technology using the TiN electrode as the electrode material is effective in making etching easy and reducing the material cost, but there is a concern that the characteristic of the element is degraded by the oxidation of TiN; non-patent document 4 does not disclose the optimum range of the TiN electrode. Thirdly, as disclosed in patent document 2, the technology in which Pt is used as the upper electrode material and Ti is used as the lower electrode material, has problems that the possibility of the Pt electrode constituting the upper electrode is difficult, and there is a concern that the characteristic of the element is degraded by the oxidation of the lower electrode material.

The present invention is made to overcome the conventional problems described above: an object of the present invention is to provide a nonvolatile storage element that, in a nonvolatile semiconductor device having a variable resistance layer, reduces the occurrence of the degradation of the electrical characteristic of the element, that easily processes an electrode and that can reduce the cost and is also to provide a manufacturing method of such a nonvolatile storage element.

The configuration of the present invention for achieving the object is as follows.

According to the present invention, a nonvolatile storage element includes: a first electrode; a second electrode; and a variable resistance layer which is sandwiched between the first electrode and the second electrode and in which a resistance value changes to two different resistance states, wherein at least one of the first electrode and the second electrode is an electrode including a metallic nitride layer containing at least Ti and N, and a mole ratio (N/Ti ratio) between Ti and N in at least a part of the metallic nitride layer, the part being in contact with the variable resistance layer is 1.15 or more and a film density is 4.7 g/cc or more.

According to the present invention, a manufacturing method of a nonvolatile storage element including: a first electrode; a second electrode; and a variable resistance layer which is sandwiched between the first electrode and the second electrode and in which a resistance value changes to two different resistance states, at least one of the first electrode and the second electrode being an electrode including a metallic nitride layer containing at least Ti and N, includes a step of forming the metallic nitride layer in which a mole ratio (N/Ti ratio) between Ti and N in at least a part of the metallic nitride layer, the part being in contact with the variable resistance layer is 1.1 or more, a film density is 4.7 g/cc or more and the crystalline orientation X satisfies 1.2<X.

According to the present invention, it is possible to realize an electrode suitable for a variable resistance nonvolatile semiconductor element by controlling the film composition, the film density and the crystalline orientation of TiN.

DESCRIPTION OF EMBODIMENTS

An embodiment of the present invention will be described in detail below with reference to accompanying drawings.

The inventors of the present invention have studied a titanium nitride film structure suitable for resistance change in a variable resistance nonvolatile semiconductor device including a variable resistance layer and electrodes formed of a metallic nitride layer containing Ti and N as first and second electrodes, and consequently have found that it is possible to realize a variable resistance nonvolatile semiconductor device in which a mole ratio (N/Ti ratio) between Ti and N in at least a part of the metallic nitride layer, the part being in contact with the variable resistance layer is 1.15 or more and the density of the film is 4.7 g/cc or more and which has a high resistance change ratio by applying the titanium nitride film where crystalline orientation X is set within 1.1<X. Here, in the present invention, the "crystalline orientation" refers to a ratio between a (200) peak strength and a (111) peak strength (C (200)/C (111)) in the X-ray diffraction spectrum of a metallic nitride layer containing Ti and N.

Figure 1:
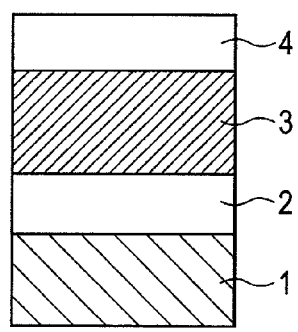
FIG. 1 is a diagram showing a cross section of an element structure according to an embodiment of the present invention.

A titanium nitride film suitable for a variable resistance element in the embodiment of the present invention will be described using an example of the variable resistance element of FIG. 1. As shown in FIG. 1, a titanium nitride film 2 that is a first electrode is formed on a base substrate 1 having a silicon oxide film on its surface, a variable resistance layer 3 is formed on the titanium nitride film 2 and a titanium nitride film 4 that is a second electrode is formed on the variable resistance layer 3.

Figure 2:
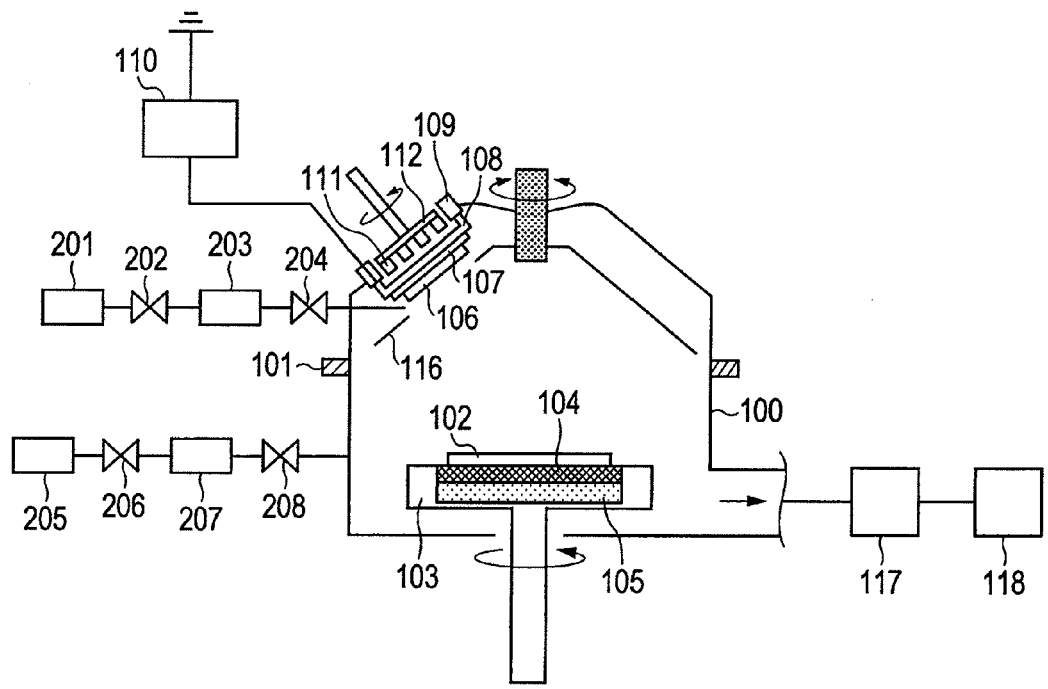
FIG. 2 is a schematic diagram of a processing device used in a step of forming a titanium nitride film according to the embodiment of the present invention.

FIG. 2 schematically shows a processing device used in a step of forming the titanium nitride film constituting the first electrode in the embodiment of the present invention.

A film formation processing chamber 100 is configured to be able to be heated with a heater 101 to a predetermined temperature. A substrate to be processed 102 is heated with a heater 105 to a predetermined temperature through a susceptor 104 incorporated in a substrate supporting table 103. In terms of the unevenness of film thickness, the substrate supporting table 103 can be preferably rotated at a predetermined number of revolutions. Within the film formation chamber, a target 106 is placed in such a position as to face the substrate to be processed 102. The target 106 is placed in a target holder 108 through a back plate 107 formed of a metal such as Cu. An outside shape of a target assembly obtained by combining the target 106 and the back plate 107 is formed of a target material as one component, and this may be attached as the target. In other words, a configuration in which the target is placed in the target holder may be adopted. A direct current power supply 110 for applying a sputter discharge power is connected to the target holder 108 formed of a metal such as Cu; the target holder 108 is insulated by an insulator 109 from the wall of the film formation processing chamber 100 at a ground potential. Behind the target 106 seen from a sputter surface, a magnet 111 for realizing magnetron sputtering is arranged. The magnet 111 is held by a magnet holder 112, and can be rotated by a magnet holder rotation mechanism, which is not shown. In order to make even the erosion of the target, during discharge, the magnet 111 is rotated. The target 106 is placed in an offset position located obliquely upward with respect to the substrate 102. In other words, the center point of the sputter surface of the target 106 is placed in a position displaced by a predetermined distance with respect to the normal to the center point of the substrate 102. Between the target 106 and the substrate to be processed 102, a shield plate 116 is disposed, and controls the formation of the film on the substrate to be processed 102 by sputter particles discharged from the target 106 to which power is fed.

As the target, for example, a metallic target 106 formed of Ti can be used. The direct current power supply 110 feeds power to the metallic target 106 through the target holder 108 and the back plate 107, and thus the deposition of the titanium nitride film is performed. Here, an inert gas is introduced into the processing chamber 100 from an inert gas source 201 through a valve 202, a mass flow controller 203 and a valve 204 in the vicinity of the target. A reactive gas formed of nitrogen is introduced into the vicinity of the substrate within the processing chamber 100 from a nitrogen gas source 205 through a valve 206, a mass flow controller 207 and a valve 208. The inert gas and the reactive gas introduced are exhausted through a conductance valve 117 by an exhaust pump 118.

The deposition of the titanium nitride in the embodiment of the present invention is performed using argon as the sputtering gas and nitrogen as the reactive gas. As appropriate, a substrate temperature can be determined from the range of 27° C. to 600° C., a target power can be determined from the range of 50 W to 1000 W, a sputter gas pressure can be determined from the range of 0.2 Pa to 1.0 Pa, an Ar flow rate can be determined from the range of 0 sccm (standard cc/min) to 100 sccm and a nitrogen gas flow rate can be determined from the range of 0 sccm to 100 sccm. Here, the deposition is performed by setting the substrate temperature at 30° C., the target power of Ti at 750 W and the sputter gas pressure at 0.2 Pa and by changing the argon gas flow rate from 0 sccm to 20 sccm and the nitrogen gas flow rate from 2 sccm to 50 sccm. The mole ratio between Ti element and N element in the titanium nitride film and the crystalline orientation can be adjusted by a mixture ratio between argon and nitrogen introduced at the time of sputtering. The "mole ratio" in the present specification refers to a ratio of the number of moles that are a basic unit of the amount of substance. The mole ratio between Ti element and N element can be measured by, for example, X-ray photoelectron spectroscopy from a specific electron binding energy and an electron energy level and an electron strength distribution, within a substance.

Then, the variable resistance layer 3 is formed with the same film formation device as used in the step of forming the first electrode 2. As a material used as the variable resistance layer 3, there are oxides including one or two or more elements selected from a group formed of transition metals; examples of the oxides include a nickel oxide (NiO), a vanadium oxide ($V_2O_5$), a zinc oxide (ZnO), a niobium oxide ($Nb_2O_5$), a titanium oxide ($TiO_2$), a tungsten oxide ($WO_3$), a cobalt oxide (CoO) and a tantalum oxide ($Ta_2O_5$). As the material used as the variable resistance layer 3, there are metallic oxides that have compositions displaced from stoichiometric compositions formed of Ni, Ti, Ta, Hf, Nb, Zn, W, Co and the like. A metallic oxide containing Hf and Al is also one example. Here, a metallic target of Hf and a metallic target of Al are used, and thus a metallic layer containing Hf and Al is deposited.

Then, annealing processing is performed on the metallic film containing Hf and Al deposited under an oxygen atmosphere of 300° C. to 600° C., and thus the variable resistance layer of the metallic oxide is formed. The annealing processing is preferably performed under an oxygen atmosphere of 300° C. or more. The annealing processing is also preferably performed under an oxygen atmosphere of 600° C. or less in order to suppress the decrease in the characteristic of the element caused by the oxidation of the titanium nitride film constituting the first electrode. The annealing processing at 600° C. or more causes the titanium nitride film to be oxidized and thus no change in resistance is produced.

Then, the titanium nitride film is deposited as a second electrode 4 by the same method as in the step of forming the first electrode 2.

Then, lithography technology and RIE (reactive ion etching) technology are used to process the TiN film into a desired size and form the element. The composition of the deposited titanium nitride film was analyzed by X-ray photoelectron spectroscopy (XPS). The crystalline orientation of the titanium nitride film was analyzed by X-ray diffraction (XRD). The density of the film was analyzed by X-ray reflectivity (X-ray reflect meter). The resistance change characteristic of the produced element was evaluated by I-V measurement.

Figure 3:
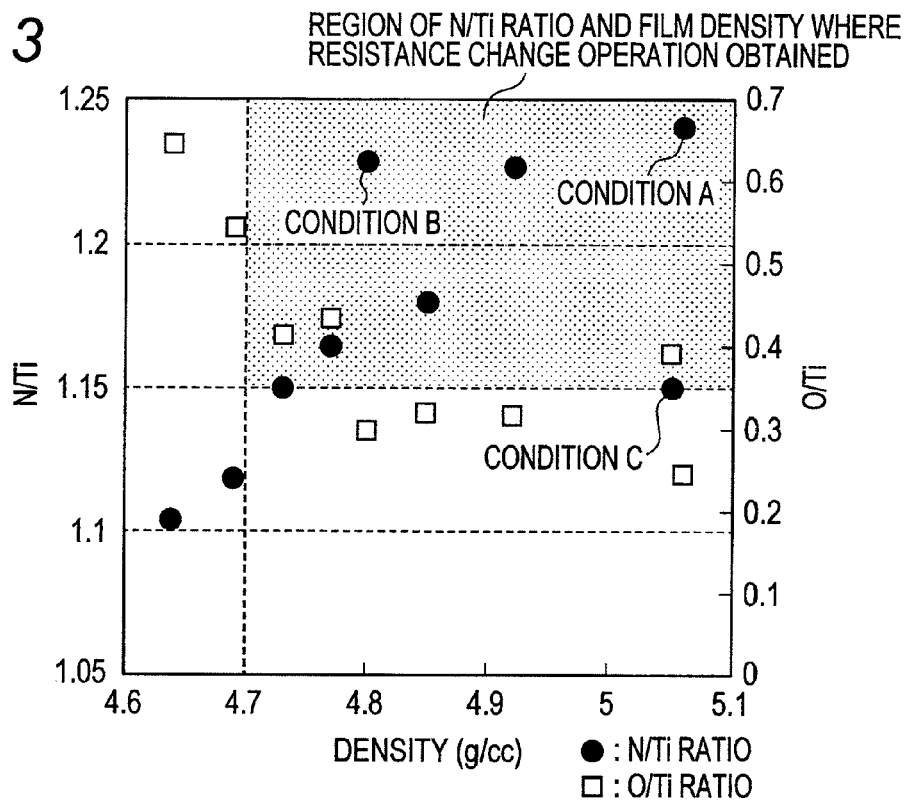
FIG. 3 is a diagram showing a relationship between the film composition and the film density of the titanium nitride film according to the embodiment of the present invention and an effective work function.

FIG. 3 shows, in the embodiment of the present invention, a relationship between the film composition (N/Ti ratio: corresponding to ● in the figure) of nitrogen N and titanium Ti in the titanium nitride film and the film composition (O/Ti ratio: corresponding to □ in the figure) of oxygen O and titanium Ti in the titanium nitride film and the density of the film. As a result of the evaluation of the switching characteristic of the variable resistance element produced in the present embodiment, it has been found that, in a region where the density of the film shown in the figure is 4.7 g/cc or more and the film composition N/Ti ratio is 1.15 or more, the switching operation caused by resistance change is obtained. On the other hand, it has also been found that, in a region where the density of the film shown is less than 4.7 g/cc and the film composition N/Ti ratio is less than 1.15, the switching operation caused by resistance change is obtained. This is probably because, in a region where the density of the film is less than 4.7 g/cc and the film composition N/Ti ratio is low, the film composition N/Ti ratio shown in FIG. 3 is increased. In other words, this suggests that, when oxygen in the variable resistance layer is somewhat moved into the titanium nitride film, the resistance change by application of voltage is not caused.

Figure 4:
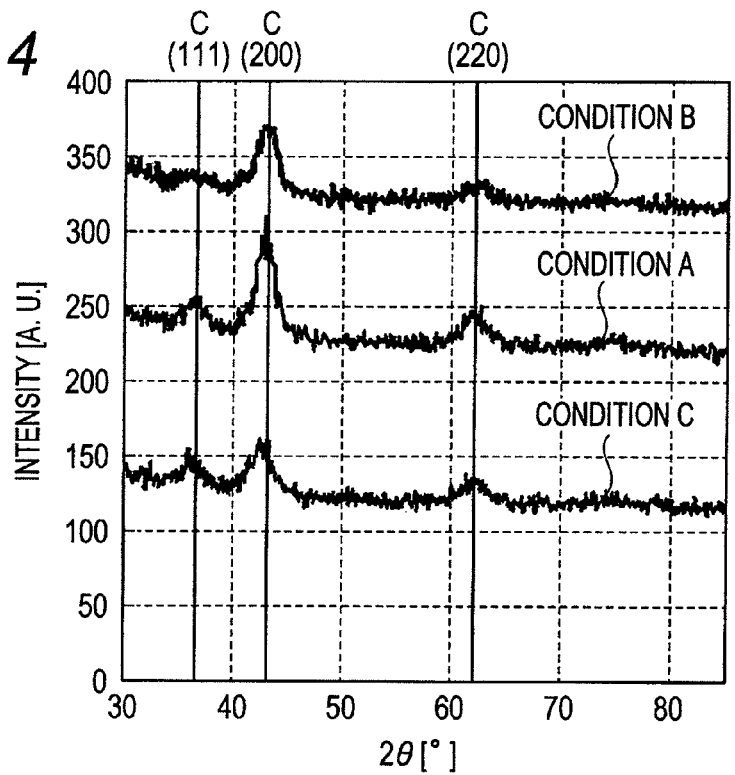
FIG. 4 is a diagram showing an XRD diffraction spectrum in the titanium nitride film according to the embodiment of the present invention.

FIG. 4 shows an XRD spectrum of titanium nitride film deposited under condition A (the argon gas flow rate is 10 sccm and the nitrogen gas flow rate is 10 sccm), condition B (the argon gas flow rate is 0 sccm and the nitrogen gas flow rate is 50 sccm) and condition C (the argon gas flow rate is 13.5 sccm and the nitrogen gas flow rate is 6 sccm). C (111), C (200) and C (220) in FIG. 4 represent the crystal planes of the titanium nitride film, that is, (111) plane, (200) plane and (220) plane, respectively. As shown in the figure, the titanium nitride film with which to obtain the resistance change operation in the embodiment of the present invention has a crystalline structure with high crystalline orientation on the (200) plane.

Figure 5:
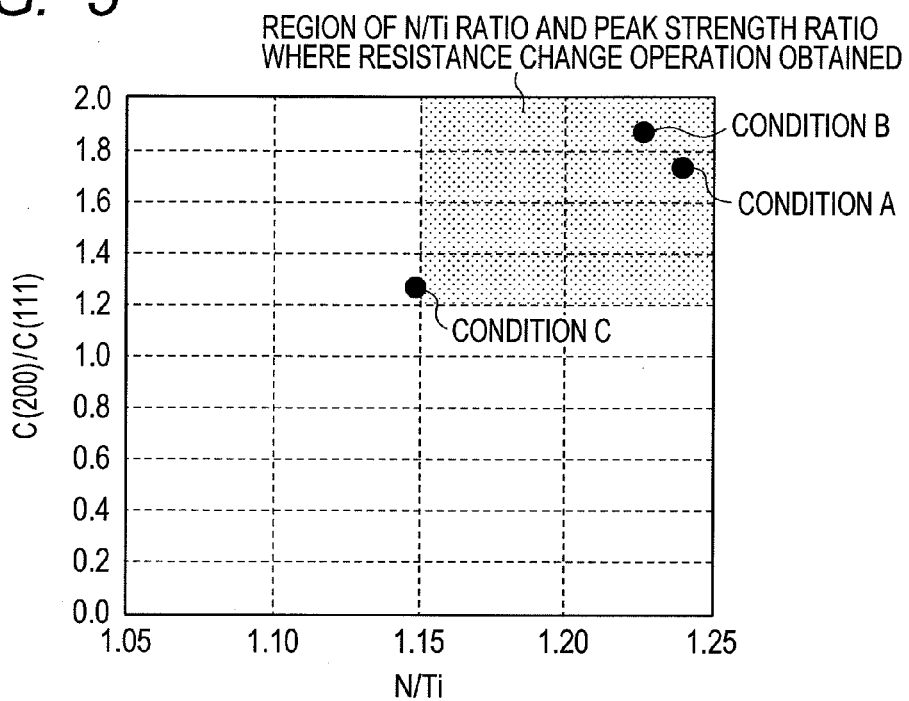
FIG. 5 is a diagram showing a relationship between a peak strength ratio in the XRD diffraction spectrum and the film composition in the titanium nitride film according to the embodiment of the present invention.
Figure 6:
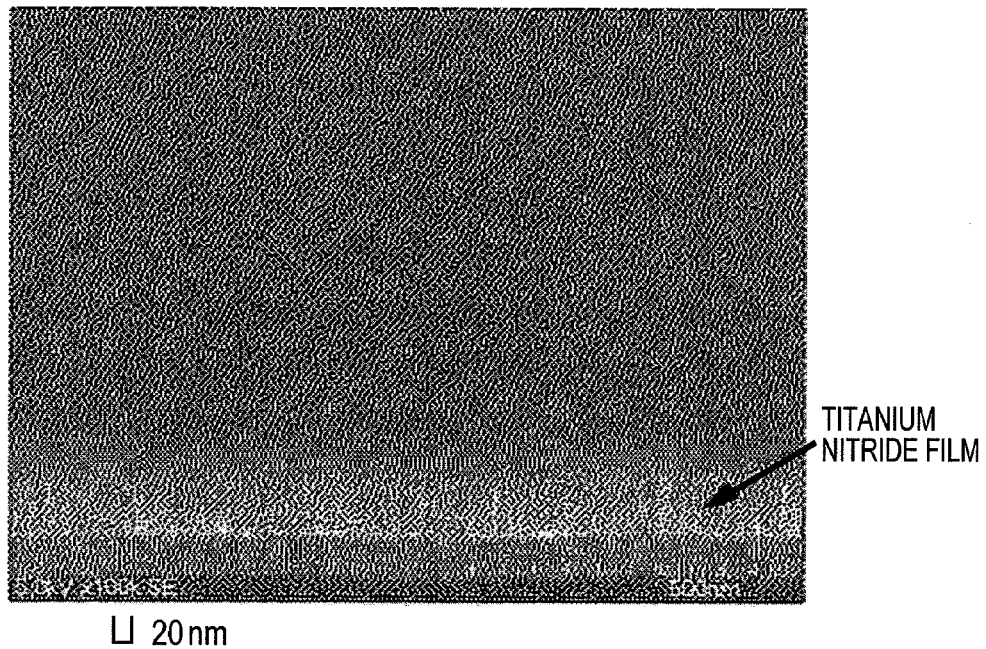
FIG. 6 is a diagram showing an image observed by a SEM, of the titanium nitride film according to the embodiment of the present invention.

FIG. 5 shows a relationship between the film composition (N/Ti ratio) of the titanium nitride film in the embodiment of the present invention and a peak strength ratio C (200)/C (111) on the (111) plane and the (200) plane in the XDR spectrum shown in FIG. 4. As shown in FIG. 5, the titanium nitride film where the film composition N/Ti ratio at which to obtain the resistance change operation in the embodiment of the present invention is 1.15 or more has a peak strength (crystalline orientation) of 1.2 or more. Here, the morphology of the titanium nitride film whose peak strength (crystalline orientation) is 1.2 or more was evaluated by the observation of a cross section and a surface with a SEM (scanning electron microscope). FIG. 6 shows an image observed with the SEM, of the titanium nitride film deposited under condition A. As shown in FIG. 6, it has been found that the titanium nitride film in the embodiment of the present invention has a columnar structure where the grain size is 20 nm or less and excellent surface evenness. The small grain size and the excellent surface evenness probably reduce a leak current resulting from a grain boundary and allow a high resistance change ratio necessary for the variable resistance element to be obtained. The small grain size and the closely packed crystalline structure probably lead to the enhancement of the density of the film.

Consequently, in the titanium nitride film in the embodiment of the present invention, in order to obtain the resistance change operation, the mole ratio between Ti and N in the titanium nitride film is preferably 1.15 or more, and furthermore, the density of the film is preferably 4.7 g/cc or more. The C (220)/C (111) peak strength ratio X in the XRD spectrum representing the crystalline orientation of the metallic nitride layer is preferably 1.2 or more.

Since the step of depositing the titanium nitride film in the embodiment of the present invention reduces the degradation of the element characteristic caused by plasma damage on the variable resistance layer 3 and controls the composition and the crystalline orientation, the step of depositing the titanium nitride film is preferably a step in which, as shown in FIG. 2, within a vacuum vessel 100 where the target 106 is placed in an offset position obliquely upward with respect to the substrate 102, under a mixed atmosphere of a reactive gas of nitrogen and an inert gas (for example, argon), magnetron sputtering is performed on the Ti target 106. In the step of depositing the titanium nitride film, the mixture ratio of the nitrogen gas and the inert gas is preferably set such that the mole ratio between Ti and N in the metallic nitride layer is 1.15 or more and that the crystalline orientation X1 satisfies 1.2<X.

Although the above description has been given of the element containing Hf and Al as the variable resistance layer 3, the present invention is not limited to this; the effects of the present invention can be obtained even if a metal oxide containing at least one of Ni, Ti, Ta, Hf, Zr, V, Zn, Nb, W and Co is used as the variable resistance layer 3.

As the step of forming the variable resistance layer 3, a method may be used of forming a laminate film containing a metallic film of Hf and Al with the Hf target 106 and the Al target 106 and then performing annealing processing under an oxygen atmosphere of 300° C. to 600° C.

As the step of forming the variable resistance layer 3, a method may be used of depositing a metallic film containing Hf and Al with co-sputtering of the Hf target 106 and the Al target 106 and then performing annealing processing under an oxygen atmosphere at a temperature of 300° C. to 600° C.

As the step of forming the variable resistance layer 3, a step may be used of magnetron-sputtering the Hf target 106 and the Al target 106 under a mixed atmosphere of a reactive gas of oxygen and an inert gas.

As the step of forming the variable resistance layer 3, a metallic film selected from at least one of Ni, Ti, Ta, Hf, Zr, V, Zn, Nb, W and Co and its laminate film may be deposited, and then annealing processing may be performed under an oxygen atmosphere of 300° C. to 600° C.

As the step of forming the variable resistance layer 3, a step may be used of magnetron-sputtering a metallic target selected from at least one of Ni, Ti, Ta, Hf, Zr, V, Zn, Nb, W and Co under a mixed atmosphere of a reactive gas of oxygen and an inert gas.

Although the above description has been given of the structure of the variable resistance element including the titanium nitride film as the first electrode and the second electrode, the present invention is not limited to this; if at least one of the electrodes includes the titanium nitride film satisfying the conditions of the present invention, it is possible to sufficiently obtain the effects. In this case, as the one of the electrodes, an electrode containing any one of metals that are Pt, Ru, W and Ir can be selected.

Figure 10:
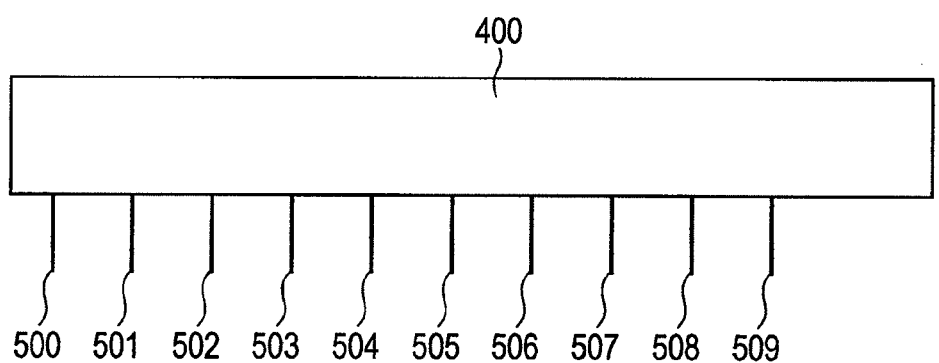
FIG. 10 is a schematic diagram of a control device 400 that controls a processing device shown in FIG. 2.

A description will now be given of a control device 400 for controlling the processing device shown in FIG. 2 used in the step of forming the titanium nitride film that is the material of the first electrode 2 or the second electrode 4 of the present embodiment. FIG. 10 is a schematic diagram of the control device 400 for controlling the processing device shown in FIG. 2. Valves 202, 204, 206 and 208 can be controlled by the control device 400 through control input/output ports 500, 501, 502 and 503 such that the valves are opened and closed. The mass flow controllers 203 and 207 can be adjusted in the flow rate by the control device 400 through control input/output ports 504 and 505. The conductance valve 117 can be adjusted in the degree of opening by the control device 400 through a control input/output port 506. The heater 105 can be adjusted in temperature by the control device 400 through an input/output port 507. The rotation of the substrate supporting table 103 can be adjusted in the number of revolutions by the control device 400 through an input/output port 508. The direct current power supply 110 can be adjusted in frequency and supply power by the control device 400 through an input/output port 509.

In the embodiment of the present invention, the control mechanism 400 controls the mixture ratio of the argon gas and the nitrogen gas introduced at the time of the sputtering film formation such that the mole ratio (N/Ti ratio) between Ti and N in at least a part of the metallic nitride layer, the part being in contact with the variable resistance layer 3, is 1.15 or more and the density of the film is 4.7 g/cc or more.

Figure 11:
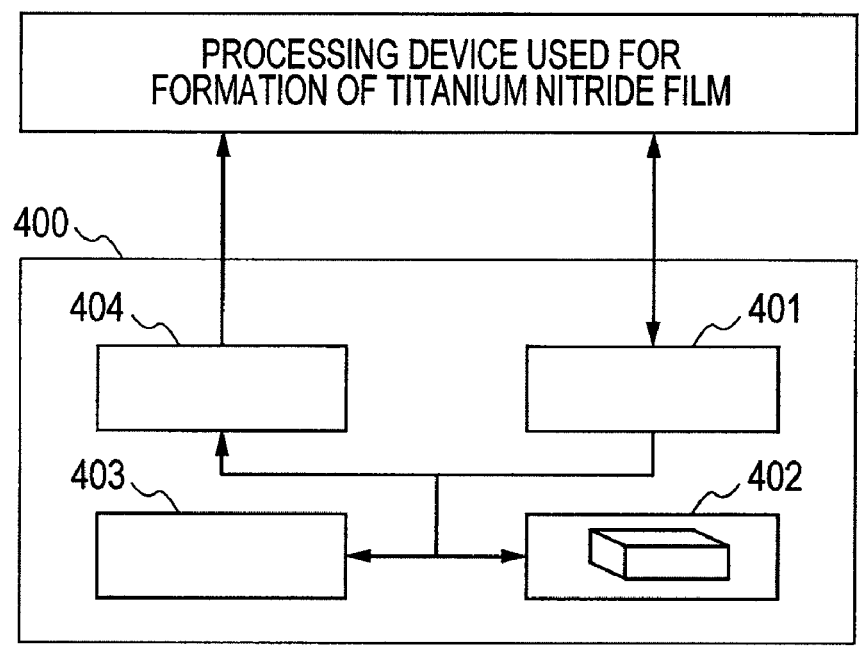
FIG. 11 is a diagram showing the internal configuration of the control mechanism 400 shown in FIG. 10.
Figure 12:
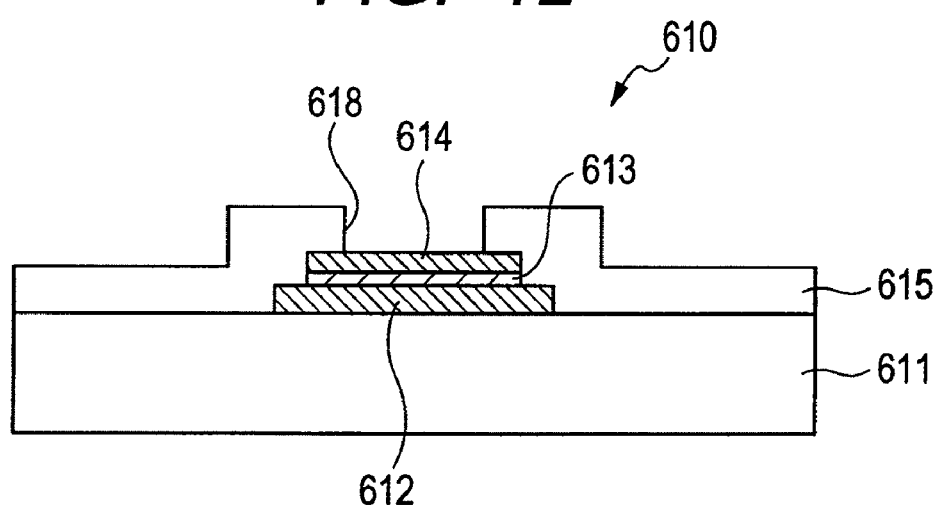
FIG. 12 is a schematic diagram showing a cross-sectional structure of a conventional variable resistance nonvolatile storage element (ReRAM: resistive random access memory).

FIG. 11 shows the internal configuration of the control mechanism 400. The control mechanism 400 includes an input portion 401, a storage portion 402 having programs and data, a processor 403 and an output portion 404, basically has a computer configuration and controls the processing device shown in FIG. 2.

In the storage portion 402, a program for providing an instruction to control the step of forming the first electrode and the second electrode to the computer and a program for providing an instruction to control the step of forming the variable resistance layer between the first electrode and the second electrode are stored.

The specific programs within the storage portion 402 are formed with individual programs for performing: a step of forming, as the first electrode, the metallic nitride layer in which the mole ratio (N/Ti ratio) between Ti and N is 1.15 or more, that the density of the film is 4.7 g/cc or more and that the crystalline orientation X satisfies 1.2<X; a step of forming the metallic film containing Hf and Al; a step of forming the variable resistance layer formed of a metallic oxide by a heat treatment of the metallic film under an oxygen atmosphere of 300° C. to 600° C.; and a step of forming, as the second electrode, the metallic nitride layer in which the mole ratio (N/Ti ratio) between Ti and N is 1.15 or more, that the density of the film is 4.7 g/cc or more and that the crystalline orientation X satisfies 1.2<X.

First Embodiment

A first embodiment of the present invention will be described in detail with reference to accompanying drawings.

Figure 7:
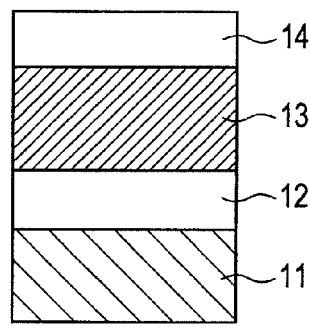
FIG. 7 is a diagram showing a cross-sectional structure of an element according to a first embodiment of the present invention.

FIG. 7 is a schematic cross-sectional view of the structure of an element according to the first embodiment. On a silicon substrate 11 having a silicon oxide layer of 100 nm thick on its surface, with the processing device shown in FIG. 2, at an argon gas flow rate of 10 sccm and at a nitrogen gas flow rate of 10 sccm, an titanium nitride film 12 of 20 nm in which the mole ratio (N/Ti ratio) between Ti and N is 1.15 or more and the crystalline orientation X satisfies 1.2<X is deposited using the Ti metallic target. Thereafter, annealing processing is performed for 10 minutes under a nitrogen atmosphere of 500° C., and annealing processing is performed for 30 minutes under an oxygen atmosphere of 500° C., with the result that a variable resistance layer 13 formed of a metallic oxide containing Hf and Al is formed.

Then, by the same method as the titanium nitride film 12, a titanium nitride film 14 is deposited on the variable resistance layer 13. Then, lithography technology and RIE (reactive ion etching) technology were used to process the TiN film into a desired size.

The composition of the deposited titanium nitride film was analyzed by X-ray photoelectron spectroscopy (XPS). The crystalline orientation of the titanium nitride film was analyzed by X-ray diffraction (XRD). The density of the film was analyzed by X-ray reflectivity (X-ray reflect meter). The resistance change operation of the produced element was evaluated by I-V measurement.

Figure 8:
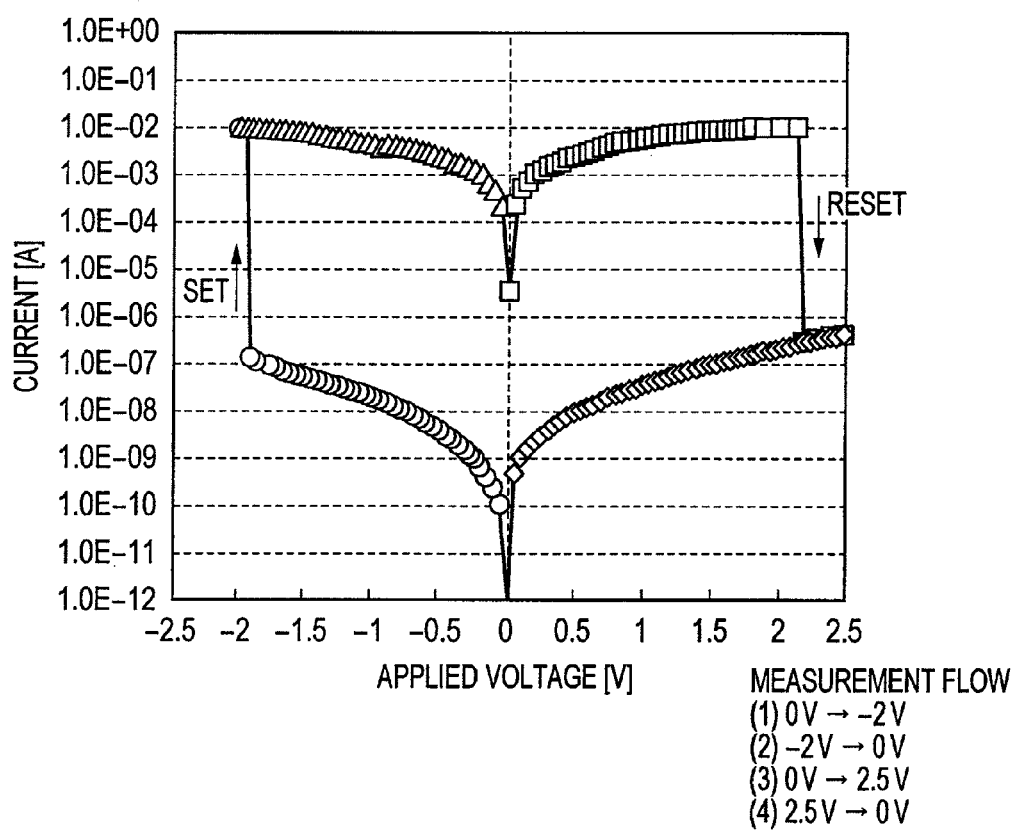
FIG. 8 is a diagram showing a current/voltage characteristic of the element according to the first embodiment of the present invention.

The I-V characteristic of the produced variable resistance element is shown in FIG. 8. The I-V characteristic was measured by grounding the titanium nitride film 12 of the element and applying, to the titanium nitride film 14, a voltage from 0 V to −2 V (corresponding to data indicated by ○ in the figure), a voltage from −2 V to 0 V (corresponding to data indicated by Δ in the figure), a voltage from 0 V to 2.5 V (corresponding to data indicated by □ in the figure) and a voltage from 2.5 V to 0 V (corresponding to data indicated by a rhombus ◇ in the figure). As shown in FIG. 8, it has been found that, when a voltage from 0 V to −2 V is applied to the titanium nitride film 14, at a voltage of −1.9 V, the current value is increased by change (a set operation) from a high resistance state to a low resistance state (a set state). Then, it has been found that, when a voltage from 0 V to 2.5 V is applied to the titanium nitride film 14, at a voltage of 2.2 V, the current value is decreased by change (a reset operation) from a low resistance state to a high resistance state (a reset state).

As described above, it has been shown that, in the variable resistance element having the titanium nitride film of the embodiment of the present invention, a variable resistance element having an on/off ratio of 103 or more between the low resistance state and the high resistance state is formed.

Figure 9:
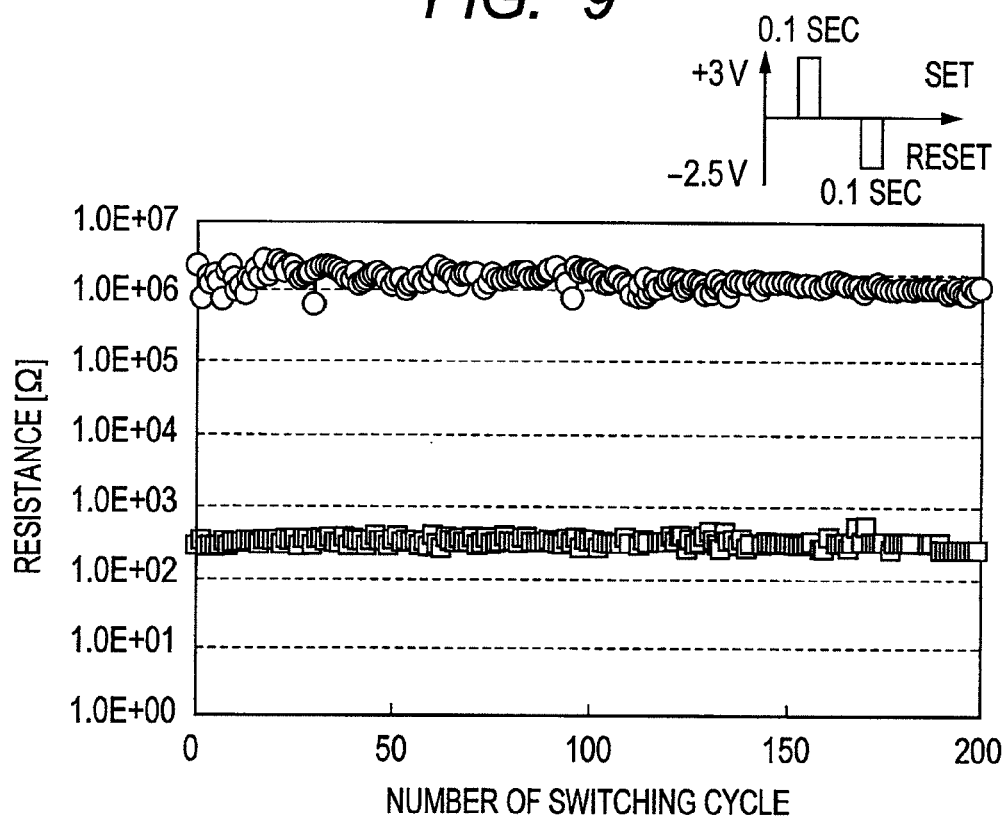
FIG. 9 is a diagram showing the endurance characteristic of the element according to the first embodiment of the present invention.

FIG. 9 shows the results of the evaluation of the endurance (the endurance characteristic) of a resistance change phenomenon by alternately and continuously applying positive and negative pulses (obtained by applying a voltage of +3 V for 0.1 second and a voltage of −2.5 V for 0.1 second; see FIG. 9) to the produced variable resistance element. FIG. 9 shows the results of measurements performed by applying the pulses up to 200 times. As shown in the figure, it has been found that the high resistance state and the low resistance state are changed according to the applied pulses, and that, even when the pulses are applied 200 times, the value (1 MΩ) in the high resistance state and the value (300 MΩ) in the low resistance state are maintained. As described above, it has not been found that, in the variable resistance element having the titanium nitride film of the embodiment of the present invention, the continuous operation with the pulses causes the degradation of the element to change the resistance value. FIG. 9 does not mean that, after the pulses have been applied 200 times, the resistance change phenomenon is not observed. Thereafter the element also indicated stable resistance change.

Although, in the above embodiment, the description has been given of the case where the metallic laminate film of Hf and Al is used as the step of forming the variable resistance layer 3, it has been found that, even if a method is used of using, as the method of forming the variable resistance layer 3, the co-sputtering of the Hf target 106 and the Al target 106 to deposit the metallic film containing Hf and Al and then performing annealing processing under an oxygen atmosphere of 300° C. to 600° C., the same effects as the above embodiment are obtained. It has also been found that, even if a method is used of using, as the step of forming the variable resistance layer 3, the step of magnetron-sputtering the Hf target 106 and the Al target 106 under a mixed atmosphere of a reactive gas of oxygen and an inert gas, the same effects as the above embodiment are obtained.

Although, in the above embodiment, the description has been given of the case where the metallic oxide containing Hf and Al as the material of the variable resistance layer 3, it has been found that, even if a metallic oxide film selected from at least one of Ni, Ti, Ta, Hf, Zr, V, Zn, Nb, W and Co and its laminate film are used, the same effects as the above embodiment are obtained.

It has been found that, even if, as the step of forming the variable resistance layer 3, a metallic film selected from at least one of Ni, Ti, Ta, Hf, Zr, V, Zn, Nb, W and Co and its laminate film is deposited, and then annealing processing is performed under an oxygen atmosphere of 300° C. to 600° C., the same effects as the above embodiment are obtained. It has also been found that, even if, as the step of forming the variable resistance layer 3, a step is used of magnetron-sputtering a metallic target selected from at least one of Ni, Ti, Ta, Hf, Zr, V, Zn, Nb, W and Co under a mixed atmosphere of a reactive gas of oxygen and an inert gas.

The invention claimed is:
1. A nonvolatile storage element, comprising:
a first electrode;
a second electrode; and
a variable resistance layer which is sandwiched between the first electrode and the second electrode and in which a resistance value changes to two different resistance states, wherein at least one of the first electrode and the second electrode is an electrode including a metallic nitride layer containing at least Ti and N, and a mole ratio (N/Ti ratio) between Ti and N in at least a part of the metallic nitride layer, the part being in contact with the variable resistance layer is 1.15 or more and a film density is 4.7 g/cc or more.

2. The nonvolatile storage element according to claim 1, wherein crystalline orientation X in at least the part of the metallic nitride layer, the part being in contact with the variable resistance layer satisfies 1.2<X.

3. The nonvolatile storage element according to claim 1, wherein the variable resistance layer includes a metallic oxide selected from at least one of Ni, Ti, Ta, Hf, Zr, V, Zn, Nb, W and Co.

4. The nonvolatile storage element according to claim 1, wherein the variable resistance layer is a metallic oxide containing Hf and Al.

5. The nonvolatile storage element according to claim 1, wherein the two different resistance states are a reset state where a low resistance changes to a high resistance and a set state where a high resistance changes to a low resistance.

6. The nonvolatile storage element according to claim 1, wherein the nonvolatile storage element is a variable resistance memory.

7. The nonvolatile storage element according to claim 6, wherein the variable resistance memory is a ReRAM.

* * * * *